United States Patent
Jain et al.

(10) Patent No.: US 9,281,043 B1
(45) Date of Patent: Mar. 8, 2016

(54) RESISTIVE MEMORY WRITE CIRCUITRY WITH BIT LINE DRIVE STRENGTH BASED ON STORAGE CELL LINE RESISTANCE

(71) Applicant: INTEL CORPORATION, Santa Clara, CA (US)

(72) Inventors: Pulkit Jain, Hillsboro, OR (US); Fatih Hamzaoglu, Portland, OR (US); Liqiong Wei, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/582,745

(22) Filed: Dec. 24, 2014

(51) Int. Cl.
  *G11C 11/00* (2006.01)
  *G11C 11/16* (2006.01)
  *G06F 12/02* (2006.01)
  *G06F 3/06* (2006.01)

(52) U.S. Cl.
  CPC .......... *G11C 11/1675* (2013.01); *G06F 3/0611* (2013.01); *G06F 3/0634* (2013.01); *G06F 3/0679* (2013.01); *G06F 12/0207* (2013.01); *G11C 11/16* (2013.01); *G11C 11/1655* (2013.01); *G11C 11/1659* (2013.01)

(58) Field of Classification Search
  CPC .. G11C 11/16; G11C 13/0069; G11C 13/004; G11C 7/02; G11C 7/062
  USPC ................ 365/148, 158, 171, 230.06, 230.07
  See application file for complete search history.

(56) References Cited

U.S. PATENT DOCUMENTS

| | | | |
|---|---|---|---|
| 7,852,665 B2* | 12/2010 | Chen | G11C 7/062 365/148 |
| 8,004,880 B2* | 8/2011 | Yoon | G11C 7/02 365/148 |
| 8,107,280 B2 | 1/2012 | Yoon et al. | |
| 8,203,899 B2* | 6/2012 | Chen | G11C 7/062 365/148 |
| 8,320,167 B2 | 11/2012 | Rao et al. | |
| 8,451,670 B2 | 5/2013 | Kolar et al. | |
| 2008/0258129 A1* | 10/2008 | Toda | G11C 11/56 257/5 |
| 2011/0149666 A1 | 6/2011 | Chang et al. | |
| 2011/0299324 A1* | 12/2011 | Li | G11C 11/16 365/148 |
| 2012/0120713 A1* | 5/2012 | Lu | G11C 11/16 365/148 |
| 2013/0135922 A1* | 5/2013 | Jung | G11C 7/12 365/148 |
| 2014/0003181 A1 | 1/2014 | Wang et al. | |
| 2014/0022836 A1* | 1/2014 | Kim | G11C 29/10 365/158 |
| 2014/0169063 A1 | 6/2014 | August et al. | |

OTHER PUBLICATIONS

Dongsoo Lee and Kaushik Roy, "Energy-Delay Optimization of STT MRAM Write Operation Under Process Variations", IEEE Transaction on Nanotechnology, vol. 13, No. 4, pp. 714-723, Jul. 1, 2014.

* cited by examiner

*Primary Examiner* — Gene Audong
(74) *Attorney, Agent, or Firm* — Blakely, Sokoloff, Taylor & Zafman LLP

(57) ABSTRACT

An apparatus is described that includes a bit line. The apparatus also includes first and second storage cells coupled to the bit line. The first storage cell has a first access transistor. The first access transistor is coupled to a first line resistance. The second storage cell has a second access transistor. The second access transistor is coupled to a second line resistance. The second line resistance is greater than the first line resistance. The apparatus also includes first and second drivers that are coupled to the bit line. The second driver is a stronger driver than the first driver. The apparatus also includes circuitry to select the first driver to write information into the first storage cell and select the second driver to write information into the second storage cell.

20 Claims, 9 Drawing Sheets

RESISTIVE MEMORY WRITE CIRCUITRY WITH BIT LINE DRIVE STRENGTH BASED ON STORAGE CELL LINE RESISTANCE

FIELD OF INVENTION

The field of invention pertains generally to the electronic arts, and, more specifically, to resistive memory write circuitry with bit line drive strength based on storage cell line resistance.

BACKGROUND

Figure 1:
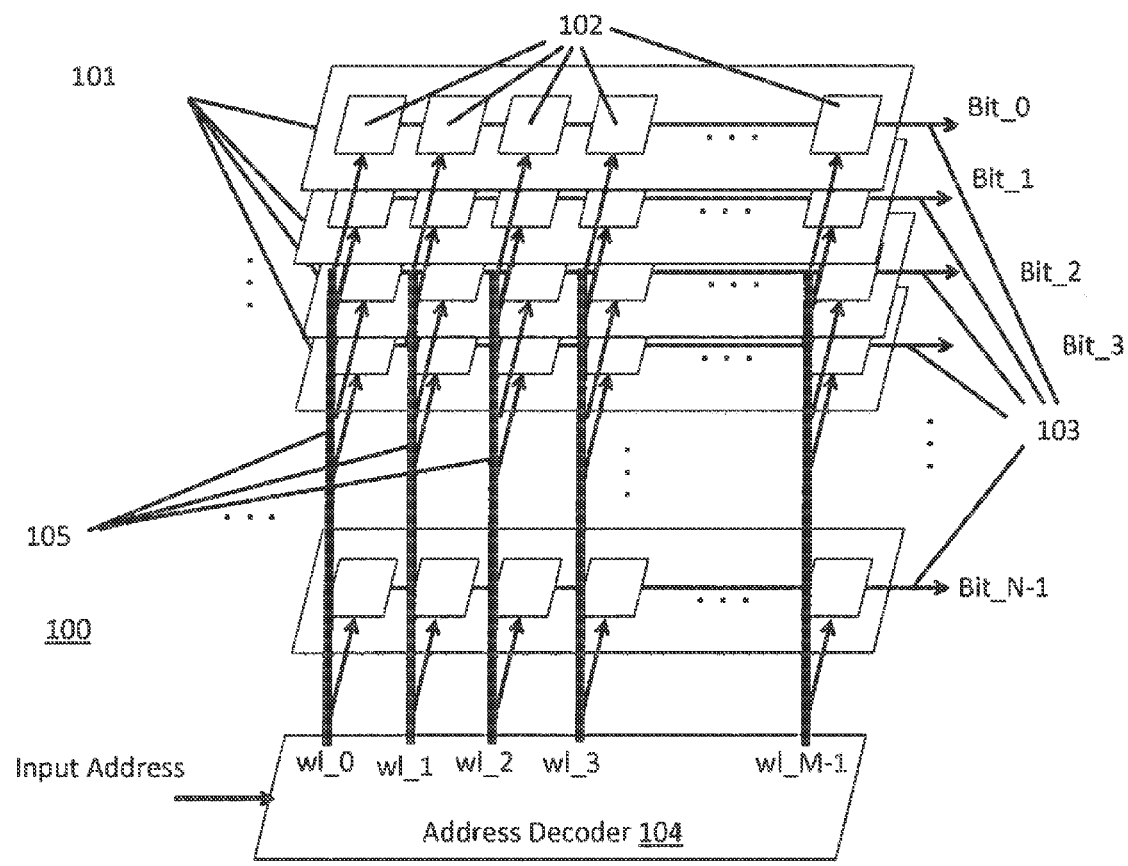

FIG. 1 shows a diagram of an architecture 100 for a random access memory implemented on a semiconductor chip. As observed in FIG. 1a, the memory architecture 100 includes multiple "slices" 101 of individual storage cells 102 each of which store a bit of information for a particular bit line 103. The memory includes a number (N) of such slices equal to the bit width of the words that are read/written from/to the memory. During a read or write operation one, same positioned storage cell in each slice if activated. In the case of a read the activated storage cell provides a bit of information on its corresponding bit line. In the case of a write the activated storage cell receives a bit of information on its corresponding bit line.

Which particular same positioned storage cell is to be activated in each of the slices by any particular memory access is determined by an address decoder 104. Here, the address decoder 104 receives an input address and, in response, activates one of multiple wordlines 105. As each wordline is coupled to a same positioned storage cell across all of the slices, the activation of one wordline in response to an address effectively enables one storage cell for each bit of the incoming/outgoing data word. A single memory chip may include just one or multiple instances of the architecture observed in FIG. 1. In the case of the later, the process of address decoding may include activating and/or deactivating whole sections of the memory that conform to the architecture of FIG. 1. Typically, the wordline dimension is referred to as a "row" and the bitline dimension is referred to as a "column".

FIGURES

Figure 2A:
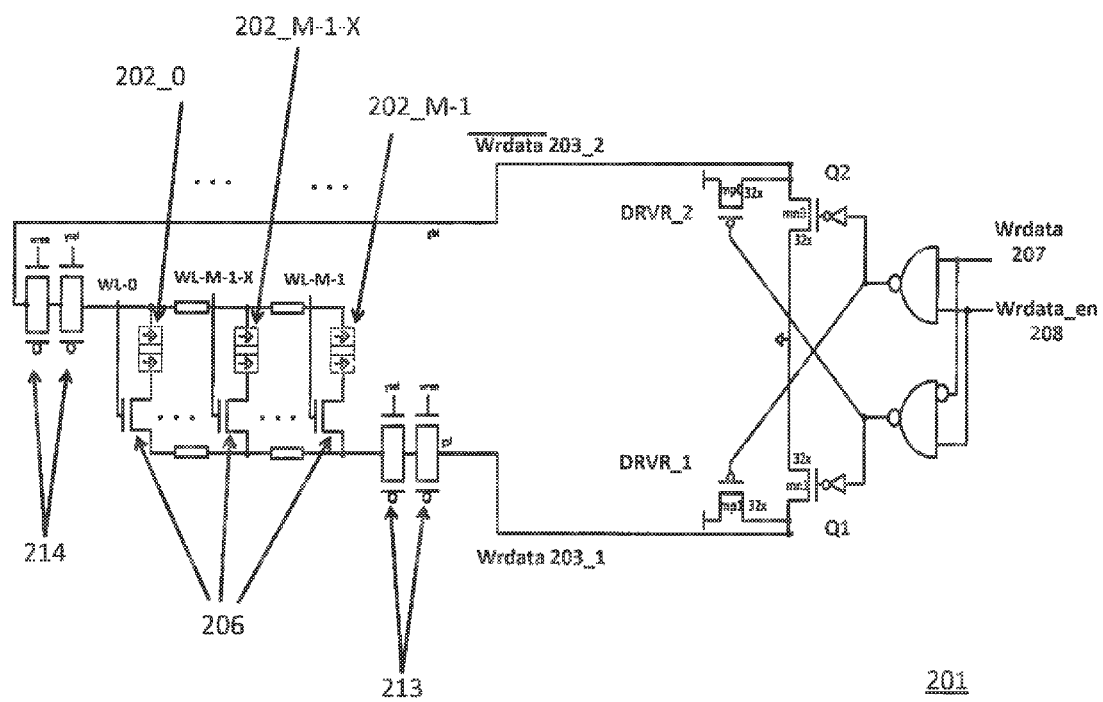
Figure 2B:
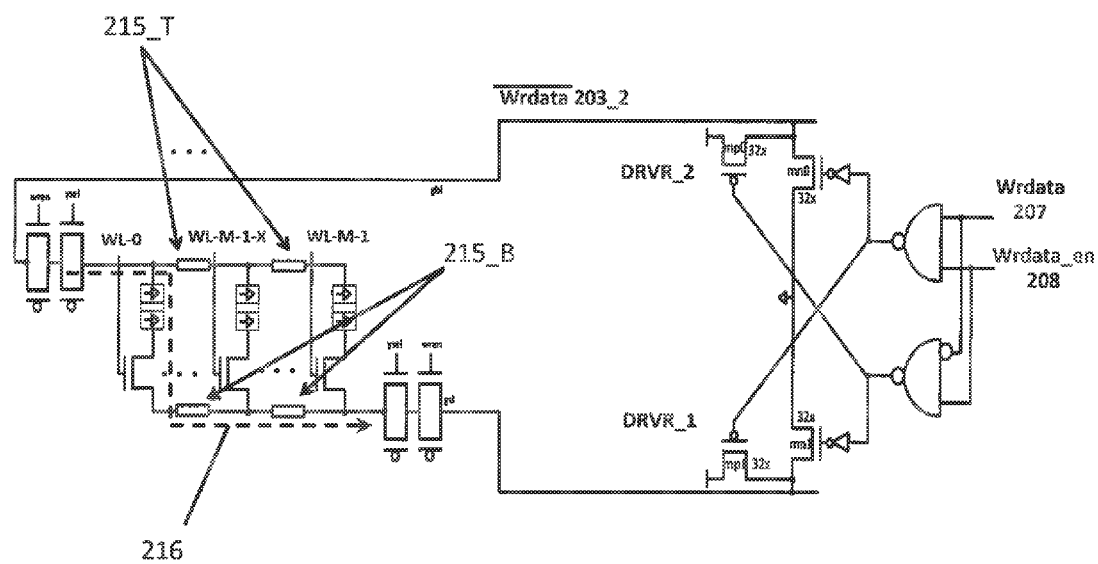
Figure 3:
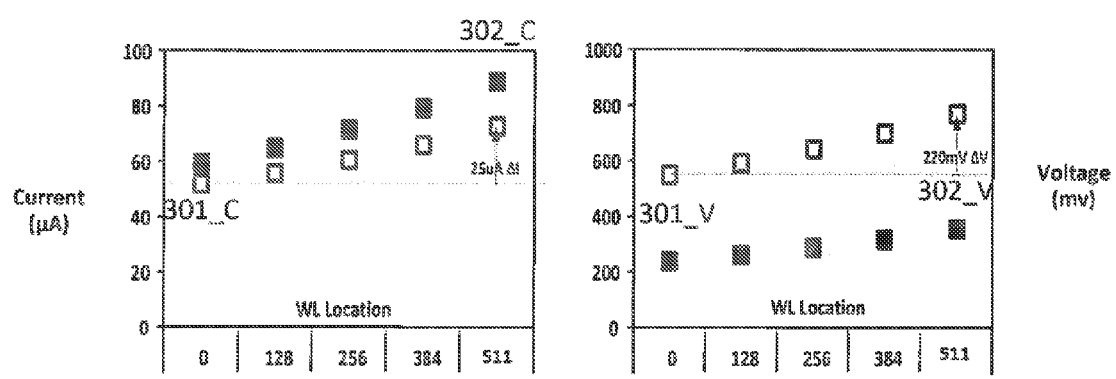
Figure 4:
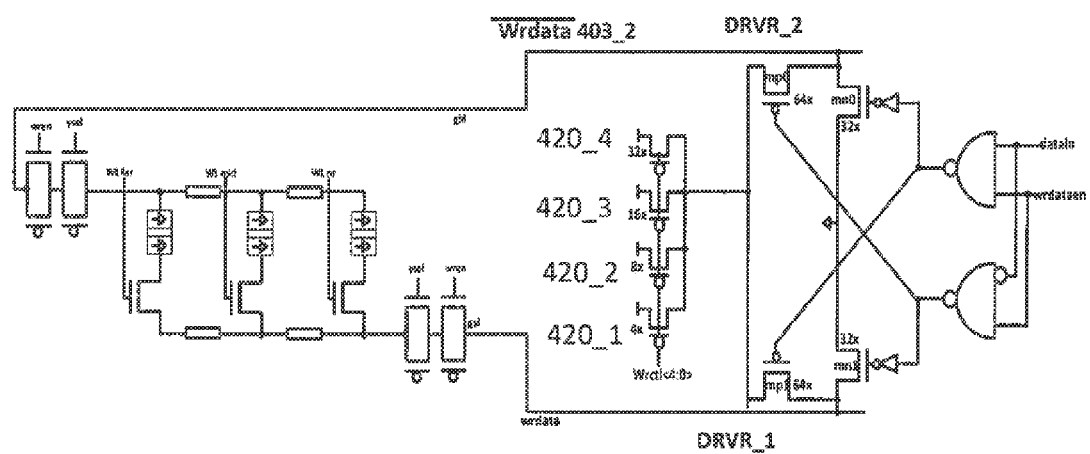
Figure 5:
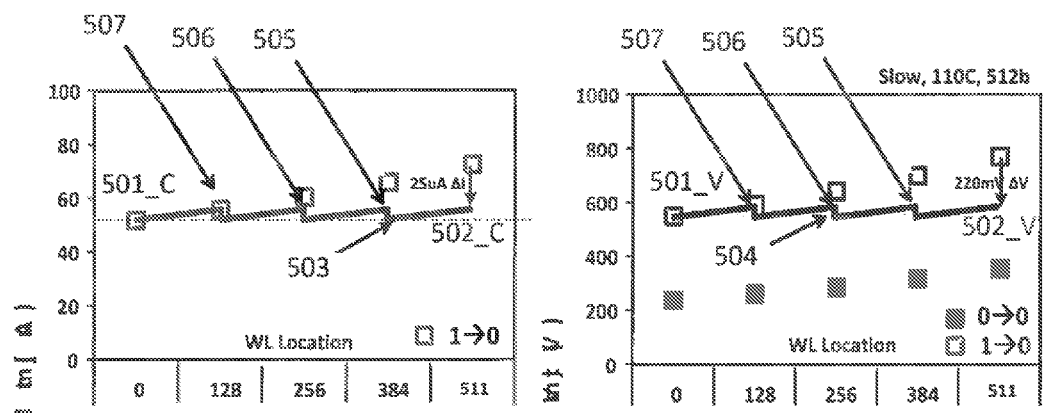
Figure 6:
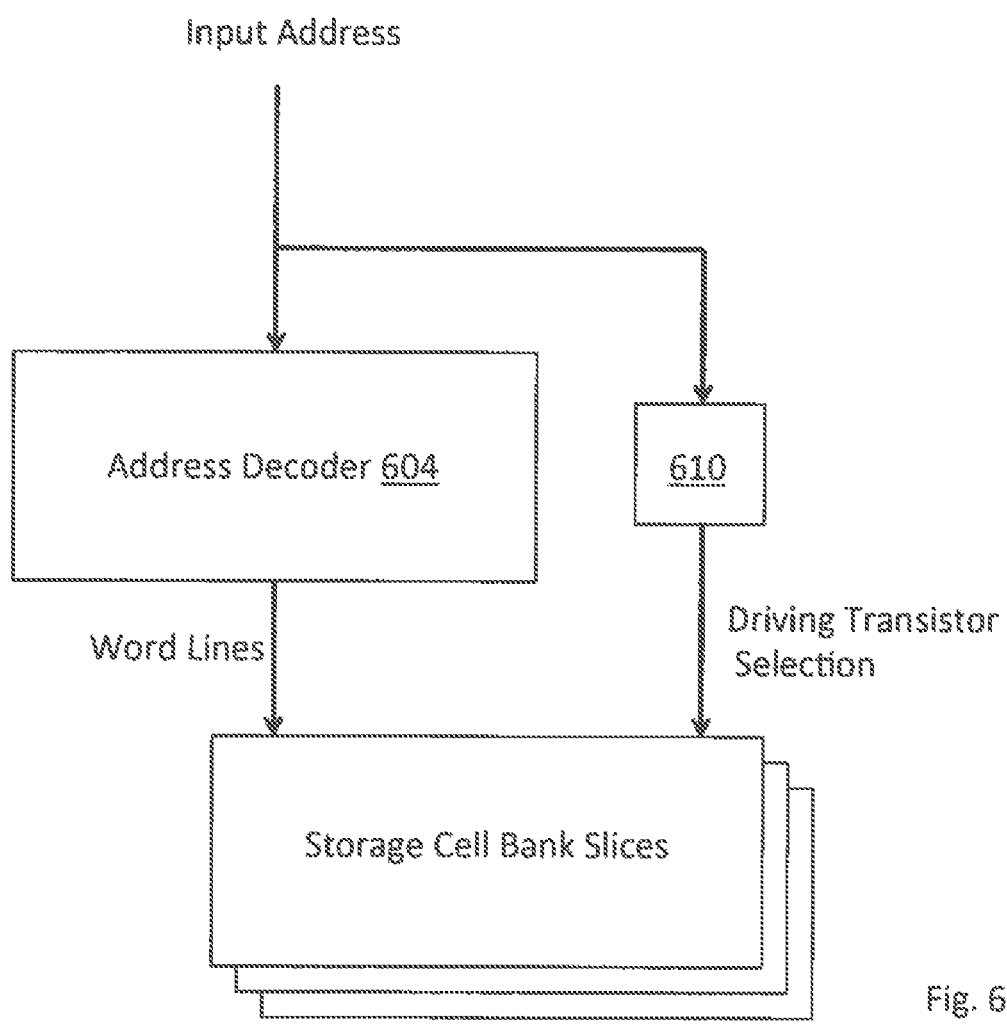
Figure 7:
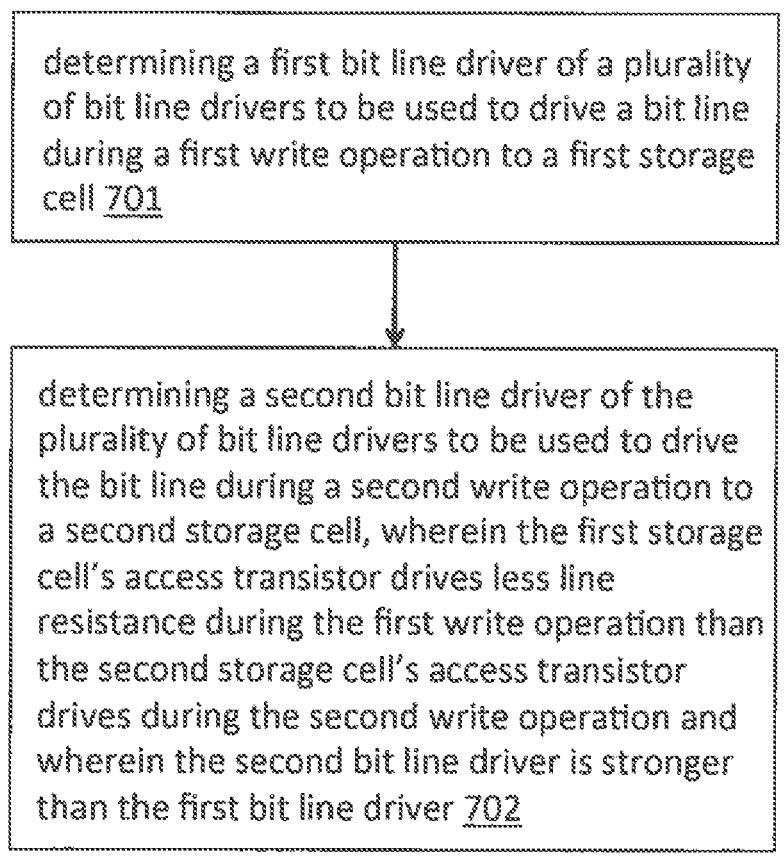
Figure 8:
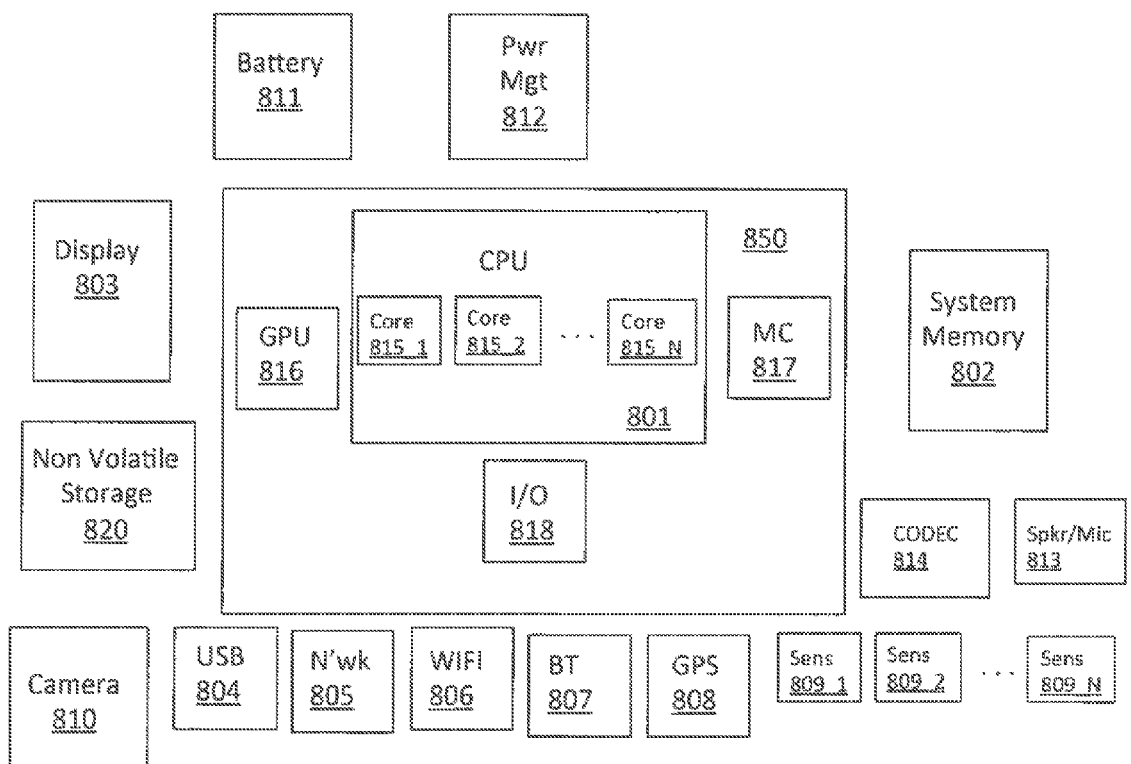

The present invention is illustrated by way of example and not limitation in the figures of the accompanying drawings, in which like references indicate similar elements and in which:

FIG. 1 shows an architecture for a random access memory;
FIG. 2a shows storage cell bank slice;
FIG. 2b shows a storage cell bank slice;
FIG. 3 graphically shows operation of the storage cell bank slice of FIGS. 2a and 2b;
FIG. 4 shows an improved storage cell bank slice;
FIG. 5 graphically shows operation of the improve storage cell bank slice of FIG. 4;
FIG. 6 shows circuitry to select driver transistors of the improved storage cell bank slice of FIG. 4;
FIG. 7 shows a method performed by the improved storage cell bank slice of FIG. 4;
FIG. 8 shows a computing system.

DETAILED DESCRIPTION

FIG. 2a shows an embodiment of a design for a slice 201 whose storage cells 202 include non volatile storage cells such as spin-transfer torque magnetic random access memory (STT-MRAM) cells or magnetic tunnel junction (MTJ) random access memory cells. As is known in the art, magnetic storage cells store a bit of information based on a magnetization direction that is held within the storage cell (e.g., a first magnetization direction corresponds to a 1 and a second magnetization direction corresponds to a 0). In a common approach, the resistance of the cell changes as a function of its magnetization direction. Thus whether a storage cell is holding a 0 or a 1 can be determined by applying a voltage across the cell and sensing the amount of current that flows through it (or driving a current through it and sensing the voltage across it).

The embodiment of FIG. 2a shows the write circuitry of the slice (that is, for simplicity, the data read sense circuitry is not shown). As observed in FIG. 2a, the slice includes M storage cells 202_0 through 202_M-1. The bitline is differential in that there exists a pair of bitlines 203_1, 203_2 that carry data values of opposite polarity. As will be clear from the description below, whether a "1" or a "0" is written into a storage cell depends on the direction of a current that is driven through the storage cell.

In the case where a 1 is to be written into a particular storage cell, initially, the word line for that storage cell is activated which turns on the storage cell's corresponding access transistor 206 (the corresponding wordlines are labeled in FIG. 2a as WL-0 through WL-M-1). The wordlines of the other storage cells are not activated which keeps their corresponding access transistor 206 off. Both sets of pass gates 213, 214 are also enabled. A voltage level corresponding to a "1" is then applied to the Wrdata input 207 and the Wrdata enable line 208 is activated. In response, the DRVR_1 and Q2 transistors are on and the DRVR_2 and Q1 transistors are off. This on/off state of the set of four transistors causes a "1" voltage level to be presented on the Wrdata bitline 203_1 and a "0" voltage level to be presented on the /Wrdata bitline 203_2. From these voltage settings a current is driven "up" vertically as observed in FIG. 2a through the storage cell that is enabled.

By contrast, in the case where a 0 is to be written into a particular storage cell, initially, the word line for that storage cell is activated which turns on the storage cell's corresponding access transistor. A voltage level corresponding to a "0" is then applied to the Wrdata input 207 and the Wrdata enable line 208 is activated. In response, the DRVR_2 and Q1 transistors are on and the DRVR_1 and Q2 transistors are off, which in turn, presents a "1" voltage level on the /Wrdata bitline 203_2 and a "0" voltage level on the Wrdata bitline 203_1. From these voltage settings a current is driven "down" vertically as observed in FIG. 2a through the storage cell that is enabled.

A problem with the operation of the slice of FIG. 2a is the effects of the resistances of the bitline traces between the storage cells when a 0 is being written into a cell. Referring to FIG. 2b, the resistances between the storage cells are shown as lumped element features 215_B, 215_T. In the case where a 0 is being written into a cell, note the difference in resistive paths beyond the access transistor for storage cells at opposite ends of the storage cell bank. Specifically, the storage cell that is coupled to wordline WL-M-1 has no lumped element resistance following its access transistor, while the storage cell that is coupled to wordline WL-0 has M-1 lumped element resistances following its access transistor. The later situation is easily seen by following current path 216.

Thus, during the write of a 0 through the WL-M-1 storage cell, the corresponding access transistor has very little resistance to drive. By contrast, during the write of a 0 through the WL-0 storage cell, the corresponding access transistor has substantial resistance to drive. Because of the substantial resistance, the turn on voltage of the WL-0 access transistor can be diminished (owing to the larger voltage that exists across the larger load resistance) which in turn diminishes its transconductance. The drop in access transistor transconductance corresponds to a need to provide more voltage along the /Wrdata bitline 203_2 during the write of a 0 when the WL-0 storage cell is being written to.

FIG. 3 shows a plot of the currents that are driven through and the voltages that are applied across the storage cells when they are being written with a 0 as a function of their position along the storage cell bank. The plot is for a slice having 512 storage cells (i.e., M=512). Solid square blocks correspond to the writing of a 0 over a pre-existing 0. "Hollow" square blocks correspond to the writing of a 0 over a pre-existing 1. Given that a larger voltage needs to be applied to storage cell at the WL-0 location (WL location=0) in FIG. 3 as discussed just above, a large amount of this voltage is consumed across the large load resistance its access transistor has to drive. This leaves minimal applied current 301_C and voltage 301_V through/across this storage cell as compared to the other storage cells in the slice. The minimal applied current 301_C and voltage 301_V are the minimum needed for successful operation of the cell, however.

When this same larger voltage is applied to the storage cell at the WL-M−1 location at the other end of the storage cell bank (WL Location=511 in FIG. 3), it is largely consumed across the storage cell itself since there is very little resistance for its access transistor to drive. As such, a higher drive current 302_C is driven through the storage cell and a larger voltage 302_V is applied across the storage cell. As labeled in FIG. 3, storage cell 511 receives 25 uA more current and 220 mv more voltage than storage cell 0.

Thus, to summarize, when writing a 0, the voltage and current that is applied to a storage cell is a strong function of the storage cell's location along the storage cell bank. The writing of 1s do not exhibit nearly as strong a relationship because, in the case of writing a 1, the resistance that follows the source is dominated by the MTJ storage device. The higher voltages and currents that are applied to the M−1 location result in reliability concerns and/or earlier failure times of the storage cell at the M−1 location.

A solution is to "tweak" the strength of the driver that drives the /Wrdata bitline 403_2 as a function of the position of the storage cell within the bank that the driver is trying to write a 0 into. FIG. 4 shows an embodiment 401 of an improved slice design that effectively selects different ones of driving transistors 420_1 through 420_4 as a function of the location of the storage cell that a 0 is being written into.

As observed in the embodiment of FIG. 4, the different driving transistors 420_1 through 420_4 have different sizes to effect different voltage levels on the /Wrdata bitline 4032 while an amount of current sufficient to write a 0 into a storage cell is being provided. Specifically, driving transistor 420_1 has a size of 4x, driving transistor 420_2 has a size of 8x, driving transistor 420_3 has a size of 16x and driving transistor 420_4 has a size of 32x (where x is a fundamental unit of size such as the number of gates and/or gate width). Apart from size, driver strength may also be affected by designing the different driver transistors with differing transconductance (e.g., through different doping densities and/or profiles). As is known in the art, driver transistor strength scales with size so driving transistor 420_4 has approximately 4 times the drive strength of driving transistor 420_1.

As such, only a negligible or small voltage drop will exist across driving transistor 420_4 when it is supplying an amount of current sufficient to write a 0 into a storage cell. In an embodiment, nearly the full supply voltage will be provided on the /Wrdata bitline 403_2 when driving transistor 420_4 is writing to a storage cell. Driving transistor 420_4 is therefore used when writing to the storage cell having the largest line resistance (e.g., the storage cell coupled to word line WL-0 in FIGS. 2a,b). The larger supply voltage provides sufficient voltage headroom to absorb the voltage drop across the line resistance and yet still maintain a proper voltage bias across the storage cell while a 0 is being written into it.

By contrast, a more significant voltage drop will exist across the smallest driving transistor 420_1 when it is supplying an amount of current sufficient to write a 0 into a storage cell. Here, it is understood that smaller driver transistors essentially have larger drain to source resistances when they are activated. As such, smaller driver transistors will exhibit more of a voltage drop across their source and terminal nodes than a larger transistor will for a same amount of current and gate voltage.

As such, when transistor 420_1 drives the /Wrdata bit line 403_2, a voltage level that is noticeably less than the full supply voltage will be provided on the /Wrdata bitline 403_2 when a 0 is being written into a storage cell. The smallest driving transistor 420_1 is therefore used when writing to the storage cell having the smallest load resistance (e.g., the storage cell coupled to word line WL-M−1 in FIGS. 2a,b). Here, there is no need to provide additional voltage headroom because there is little/no line resistance. As such, the lesser provided voltage is sufficient to properly bias the storage cell while a 0 is being written into it.

In an embodiment, driver transistors DRVR_1 and DRVR_2 are made substantially larger than any of driver transistors 420_1 through 420_4 so that their voltage drop is negligible as compared to the voltage drop across any of transistors 420_1 through 420_4. In the particular embodiment of FIG. 4, driver transistors DRVR_1 and DRVR_2 are twice the size of transistor 420_4 (64x vs. 32x).

In one embodiment, an individual one of transistors 420_1 through 420_4 is selected to drive storage cells that fall within a range of the storage cells along the slice's storage cell bank. For example, the smallest driver transistor 420_1 is used to drive storage cells that are located within a first positional range having smallest line resistance (e.g., rightmost located cells as observed in FIGS. 2a,b), the second smallest driver transistor 420_2 is used to drive storage cells that are located within a second range having second smallest line resistance (e.g., center-right located cells as observed in FIGS. 2a,b), the second largest driver transistor 420_3 is used to drive storage cells that are located within a third range having second largest line resistance (e.g., center-left located cells as observed in FIGS. 2a,b), and the largest driver transistor 420_4 is used to drive storage cells that are located within a fourth range having largest line resistance (e.g., leftmost located cells as observed in FIGS. 2a,b).

FIG. 5 shows an example of the effect that changing driver drive strength can have on the voltages and currents that are applied to the different storage cells across the slice's range of storage cell locations. Here, the operation of the improved circuit is depicted with solid lines 503, 504 that are imposed over the singular data points of the original data of FIG. 3. Importantly, when the storage cell having the least line resistance is being written to, (storage cell location 511 in FIG. 5) only the smallest driver transistor is enabled. As described at length above, the smallest driver transistor is only capable of applying a reduced supply voltage 502_V and corresponding reduced supply current 502_C.

As such, the reliability problems associated with the circuit of FIGS. 2a and 2b are avoided. That is, owing to the use of the smaller driving transistor in the improved circuit, the voltage and current applied to the storage cell having the smallest line resistance (storage cell location 511 in FIG. 5) are noticeably reduced as compared to the original data points for the same positioned storage cell in the original circuitry of FIGS. 2a and 2b. As the smallest driving transistor drives storage cells that are farther away from the storage cell having the smallest line resistance (i.e., moving to the left along curves 503, 504 from points 502_C and 502V), the voltage and current that are applied to the storage cells will increasingly decline owing to more and more of the supply voltage being devoted to the voltage drop across the line resistance.

Eventually at point 505, the next larger driver transistor will be activated which will be able to supply a nominally larger supply voltage to the next storage cell having an even larger incremental line resistance. Again as the next larger driving transistor drives storage cells having incrementally increasing line resistance the voltages and currents that are applied to the storage cells will decline (moving left along curves 503, 504 from point 505). At point 506 the next larger driver transistor will be activated and the circuit operates similarly as described above until the largest driver transistor is activated 507. In various embodiments, the address range of storage cells written to by a same driver transistor is a contiguous address range.

As observed in FIG. 5 each driving transistor is designed to at least supply the minimum voltage and current sufficient for writing a 0 into the storage cell having the largest amount of line resistance within the range of storage cells that the driving transistor is configured to drive.

The number of driver transistors per slice may vary in embodiment to embodiment depending on the number of storage cells per slice and the granularity of the storage cell ranges that a particular driver transistor is supposed to drive. FIG. 6 shows that the decoding circuitry 610 that selects a particular driver transistor may be segregated from the address decoding circuitry 604 that enables the different word lines. Here, the address decoding circuitry 604 is designed to reduce a particular address to a singular word line (there is one enabled word line per address).

By contrast, the decoding circuitry 610 that enables a particular driver transistor based on the input address does not reduce the address to as fine a granularity. That is, because each driver transistor is configured to drive a range of storage cells, any driver transistor is essentially configured to be activated for a range of memory addresses. As such, the circuitry 610 that enables a driver transistor activates a same output to select a same driver transistor when the memory address is within a particular range (there is one enabled output line for a plurality of memory addresses).

With reference to the circuit of FIG. 4 note that in various embodiments only a particular one of the driver transistors (e.g., the smallest driver transistor 420_1) may be used when writing a "1" into a storage cell.

FIG. 7 shows a methodology that can be performed by a storage cell bank slice as described herein. As observed in FIG. 7, the method includes determining a first bit line driver of a plurality of bit line drivers to be used to drive a bit line during a first write operation to a first storage cell 701. The method also includes determining a second bit line driver of the plurality of bit line drivers to be used to drive the bit line during a second write operation to a second storage cell 702. The first storage cell's access transistor drives less line resistance during the first write operation than the second storage cell's access transistor drives during the second write operation. The second bit line driver is also stronger than the first bit line driver.

It is also pertinent to point out that the programmable driver discussed herein can be used to implement other programmable driving schemes such as data-dependent driving (drive strength is a function of the data pattern being written) and/or process-dependent driving (drive strength is a function of wafer/die measurement parameters). The former can be implemented by coupling a data-decoder between the driver and a data bus (the decoder sets specific drive strengths based on observed input data). The later can be implemented by coupling read-only-circuitry (e.g., fuses) to the driver (fuses are blown to establish nominal drive strengths of the driver). Additional details may be found in Patent Cooperation Treaty application PCT/US2013/048753 filed on Jun. 28, 2013 entitled "Low Power Write and Read Design Techniques for Resistive Memory".

The memory as described here in may be used in a computing system to implement, e.g., any of a cache, system memory, non volatile "disk" storage (storage that fetches/writes data in, e.g., "sectors" that are larger than cache lines stored in system memory), BIOS non volatile storage, etc.

FIG. 8 shows a depiction of an exemplary computing system 800 such as a personal computing system (e.g., desktop or laptop) or a mobile or handheld computing system such as a tablet device or smartphone. As observed in FIG. 8, the basic computing system may include a central processing unit 801 (which may include, e.g., a plurality of general purpose processing cores and a main memory controller disposed on an applications processor or multi-core processor), system memory 802, a display 803 (e.g., touchscreen, flat-panel), a local wired point-to-point link (e.g., USB) interface 804, various network I/O functions 805 (such as an Ethernet interface and/or cellular modem subsystem), a wireless local area network (e.g., WiFi) interface 806, a wireless point-to-point link (e.g., Bluetooth) interface 807 and a Global Positioning System interface 808, various sensors 809_1 through 809_N (e.g., one or more of a gyroscope, an accelerometer, a magnetometer, a temperature sensor, a pressure sensor, a humidity sensor, etc.), a camera 810, a battery 811, a power management control unit 812, a speaker and microphone 813 and an audio coder/decoder 814.

An applications processor or multi-core processor 850 may include one or more general purpose processing cores 815 within its CPU 801, one or more graphical processing units 816, a memory management function 817 (e.g., a memory controller) and an I/O control function 818. The general purpose processing cores 815 typically execute the operating system and application software of the computing system. The graphics processing units 816 typically execute graphics intensive functions to, e.g., generate graphics information that is presented on the display 803. The memory control function 817 interfaces with the system memory 802. During operation, data and/or instructions are typically transferred between deeper non volatile (e.g., "disk") storage 820 and system memory 802. The power management control unit 812 generally controls the power consumption of the system 800.

Each of the touchscreen display 803, the communication interfaces 804-807, the GPS interface 808, the sensors 809, the camera 810, and the speaker/microphone codec 813, 814 all can be viewed as various forms of I/O (input and/or output) relative to the overall computing system including, where appropriate, an integrated peripheral device as well (e.g., the camera 810). Depending on implementation, various ones of these I/O components may be integrated on the applications processor/multi-core processor 850 or may be located off the die or outside the package of the applications processor/multi-core processor 850.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a bit line;
first and second storage cells coupled to said bit line, said first storage cell having a first access transistor, said first access transistor coupled to a first line resistance, said second storage cell having a second access transistor, said second access transistor coupled to a second line resistance, said second line resistance being greater than said first line resistance;
first and second drivers coupled to said bit line, said second driver being a stronger driver than said first driver;
circuitry to select said first driver to write information into said first storage cell and select said second driver to write information into said second storage cell.

2. The apparatus of claim 1 wherein said first and second storage cells are resistive storage cells.

3. The apparatus of claim 1 wherein said resistive storage cells are magnetic spin transfer torque magnetic storage cells.

4. The apparatus of claim 1 further comprising a second bit line, said first and second storage cells coupled between said first and second bit lines, said first and second bit lines to transport bits of opposite polarity.

5. The apparatus of claim 1 where said first and second line resistances include resistances between storage cells of a bank of storage cells that are coupled to said bit line.

6. The apparatus of claim 1 wherein said circuitry is segregated from address decoding circuit having first and second output word lines coupled to said first and second access transistors, respectively.

7. An apparatus, comprising:
a random access memory having a bank of resistive storage cells coupled to a bit line, said bit line coupled to a plurality of different strength drivers, each of said drivers arranged to drive a different range of said storage cells, where, a strongest of said drivers is arranged to drive a first of said storage cells having a largest line resistance, and, a weakest of said drivers is arranged to drive a second of said storage cells having a smallest line resistance.

8. The apparatus of claim 7 wherein said resistive storage cells are magnetic spin transfer torque storage cells.

9. The apparatus of claim 7 further comprising a third driver of said drivers having a strength that is between the respective strengths of said strongest and said weakest drivers and that is arranged to drive a third of said storage cells having a line resistance that is between said largest and said smallest line resistances.

10. The apparatus of claim 7 wherein said strongest of said drivers is arranged to drive each storage cell of a first range of said storage cells having higher line resistance than other ranges of said storage cells that others of said drivers are respectively arranged to drive, said first range including said first of said storage cells.

11. The apparatus of claim 10 wherein said weakest of said drivers is arranged to drive each storage cell of a second range of said storage cells having lower line resistance than other ranges of said storage cells that others of said drivers are respectively arranged to drive, said second range including said second of said storage cells.

12. The apparatus of claim 10 wherein said drivers are activated from an address decoding circuit that is less granular than a decoding circuit that activates word lines of said random access memory.

13. A computing system, comprising:
a processor;
a random access memory coupled to said processor, said random access memory comprising:
a bit line;
first and second storage cells coupled to said bit line, said first storage cell having a first access transistor, said first access transistor coupled to a first line resistance, said second storage cell having a second access transistor, said second access transistor coupled to a second line resistance, said second line resistance being greater than said first line resistance;
first and second drivers coupled to said bit line, said second driver being a stronger driver than said first driver;
circuitry to select said first driver to write information into said first storage cell and select said second driver to write information into said second storage cell.

14. The apparatus of claim 13 wherein said first and second storage cells are resistive storage cells.

15. The apparatus of claim 13 wherein said resistive storage cells are magnetic spin transfer torque magnetic storage cells.

16. The apparatus of claim 15 wherein said random access memory is a system memory of said computing system.

17. The apparatus of claim 15 wherein said random access memory is a non volatile storage memory of said computing system.

18. The apparatus of claim 15 wherein said random access memory keeps BIOS information of said computing system.

19. A method, comprising:
determining a first bit line driver of a plurality of bit line drivers to be used to drive a bit line during a first write operation to a first storage cell; and,
determining a second bit line driver of said plurality of bit line drivers to be used to drive said bit line during a second write operation to a second storage cell, wherein said first storage cell's access transistor drives less line resistance during said first write operation than said second storage cell's access transistor drives during said second write operation and wherein said second bit line driver is stronger than said first bit line driver.

20. The method of claim 7 wherein the first storage cell is within a contiguous address range of storage cells that are driven by the first bit line driver and wherein the second storage cell is within a contiguous address range of storage cells that are driven by the second bit line driver.

* * * * *